United States Patent [19]

Murphy et al.

[11] Patent Number: 4,899,876

[45] Date of Patent: Feb. 13, 1990

[54] LOCKING SPRING FOR TUBULAR IC CARRIERS

[75] Inventors: Robert H. Murphy, Amherst, N.H.; Thomas C. Evans, LaPorte; Demetrios E. Kapnias, Colorado Springs, both of Colo.

[73] Assignee: R. H. Murphy Co., Inc., Amherst, N.H.

[21] Appl. No.: 341,692

[22] Filed: Apr. 21, 1989

[51] Int. Cl.⁴ ............................................. B65D 73/02
[52] U.S. Cl. .................................. 206/334; 206/328; 206/591; 267/182; 267/141
[58] Field of Search ............ 267/182, 147, 136, 140.4, 267/141; 206/328, 334, 591

[56] References Cited

U.S. PATENT DOCUMENTS

| | | | |
|---|---|---|---|
| 4,485,531 | 12/1984 | Murphy | 206/328 |
| 4,598,820 | 7/1986 | Murphy | 206/328 |
| 4,624,364 | 11/1986 | Swain | 206/328 |
| 4,635,794 | 1/1987 | Lemmer | 206/328 |

Primary Examiner—Joseph Man-Fu Moy
Attorney, Agent, or Firm—Pearson & Pearson

[57] ABSTRACT

A spring for each end of a tubular carrier to secure them against sliding and slipping within the tube. The spring having a tongue carrying on its tip an upwardly jutting pin which is upwardly resilient. The pin latches into through apertures in the top wall of the carrier and may have a camming means forward of the pin comprising a pair of ramps extending forward and down from the pin and symmetrical about a longitudinal axis.

The tongue has a base and in one embodiment extends rearward of the base. In a preferred embodiment the tongue has a base and extends forward of the base. The tongue may have a surround, and in the preferred embodiment the tongue may extend forward of a lower ledge at the rear of the surround.

In use, as the spring enters the carrier against a chip, the pin is cammed down. When the spring is compressed against the chip sufficiently, the pin enters an aperture in the top wall of the carrier, and latches the spring. Thus the spring holds the chip firmly in place relative to the carrier and prevents accidental chipping or damage to the chip.

17 Claims, 1 Drawing Sheet

U.S. Patent     Feb. 13, 1990     4,899,876
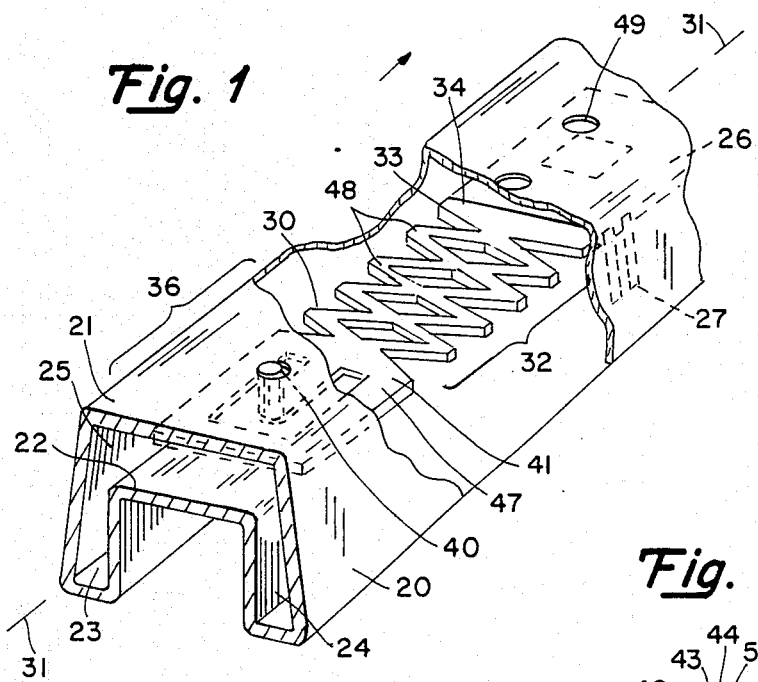

LOCKING SPRING FOR TUBULAR IC CARRIERS

FIELD OF THE INVENTION

The present invention relates to the combination of a carrier for an integrated circuit and a spring, and also to locking springs.

BACKGROUND OF THE INVENTION

U.S. Pat. No. 4,533,043 to Swain, Aug. 4, 1985, Integrated Circuit Package Magazine and Receptacle, describes a spring catch used to hold an integrated circuit chip in a carrier.

U.S. Pat. No. 4,632,794 to Lemmer, Jan. 13, 1987, for IC Rod-Magazine describes a carrier or magazine for integrated circuit chips with a spring tensioned device for holding a circuit chip in the carrier or magazine, which may be released to permit the withdrawal of the chip or chips.

U.S. Pat. No. 4,655,364 to Swapp et al., Apr. 7, 1987, for Cap for Integrated Circuit Sleeve describes an arrangement in which a hole 14 on the upper surface of a sleeve engages a catch 18 protruding from an end cap to prevent the escape of integrated circuits within the sleeve.

U.S. Pat. No. 4,685,562 to Swain, Aug. 11, 1987, for Releasable Stop Gate Device describes a tubular integrated circuit container which employs a one-piece integrally formed member having first and second legs joined along a common edge to define an acute angle. The two legs are resiliently compressible about the joined edge, and have an abutment surface integrally from the first leg. The second leg is formed for attachment with an outer sidewall surface of the container. The first leg and the abutment are arranged so that the first leg and abutment extend retractably into the tubular container.

U.S Pat. No. 3,206,067 to Smith et al., Sept. 14, 1965, describes a golf ball carrier and a device for releasing a single golf ball at a time from the carrier.

U.S. Pat. No. 4,598,820, granted to Robert H. Murphy, for Spring for Tubular IC Carriers describes a one piece spring for each end of a tubular carrier or magazine used to transport integrated circuits. The spring secures the IC chips against sliding or chipping. The spring comprises a plurality of integral sections of flexible, resilient elastomeric material of rhombus or diamond shape joined along a longitudinal center line by integral webs. The web forms a one piece, flat, thin body of uniform outside depth and width and fitting in the space between the upper and lower parallel walls of the tubular carrier.

These patents, except for Smith, deal with the problem of carrying an integrated circuit chip or element, having depending side legs, in a tubular carrier. The chips should be readily held in a manner to avoid sliding against each other, or chipping, and yet be readily available for withdrawal.

SUMMARY OF THE INVENTION

According to the invention a tubular carrier has opposed top and bottom longitudinal walls which slidably receives in a channel a relatively flat integrated circuit element or chip. An elongated one piece longitudinally compressible spring is slidable forward into the tubular carrier channel. The rearward portion of the spring has a rearwardly extending extension having a tongue upwardly resilient carrying an upwardly projecting pin. The pin has a ramp means for camming the pin down as it is forced into the channel of the carrier. When the spring is pushed forward into the channel and compressed, the resilience of the tongue raises the pin into an aperture in the top wall to latch the pin and spring to hold the chip firmly in place in the carrier. The camming means may comprise a pair of ramps on each side of the pin symmetrically on each side of the longitudinal axis extending from the top of the pin forward to the level of the tongue. In one embodiment the pin is carried at the tip of a rearwardly extending tongue having a base at the forward part of the extension. In a preferred embodiment, the pin is carried at the tip of a forwardly extending tongue having its base at a rearward part of the extension. The arrangement of the invention dispenses with the requirement of the separate manual insertion of a pin.

DESCRIPTION OF THE DRAWINGS

The various objects, advantages, and novel features of the invention will be more fully apparent from a reading of the following detailed description, when read in connection with the accompanying drawings, in which like reference characters refer to like parts, and in which:

FIG. 1 is a perspective view, partly broken away, of one embodiment of the invention;

FIG. 2 is a top view of the embodiment of FIG. 1;

FIG. 3 is an end view of FIG. 2;

FIG. 4 is a cross-sectional view of the spring alone of FIG. 2 along the sectional lines 4—4;

FIG. 5 is a perspective view, partly broken away, of another embodiment of the invention;

FIG. 6 is a different perspective view of the embodiment of FIG. 5;

FIG. 7 is a top view of the spring of FIG. 6; and

FIG. 8 is a cross-sectional view of the spring alone of FIG. 7 along the lines 8—8 of FIG. 7.

DETAILED DESCRIPTION OF THE PREFERRED EMBODIMENT

Referring to FIGS. 1-4, a tubular carrier 20 comprises top and bottom walls 21 and 22 respectively, and left and right side aisles 23 and 24 respectively. The carrier 20 slidably receives in the channel 25 defined by the top and bottom walls 21 and 22 an integrated circuit chip or element 26 having depending legs 27 on each side which are received in the side aisles 23 and 24.

A one-piece, flat spring 30 elongated along a longitudinal axis 31 has a forward portion 32, the forward termination 33 of which ends in an abutment 34 against the circuit chip 26. In the drawings except FIG. 3, where the forward direction is into the paper, the forward direction is sometimes indicated by a small arrow. The rear portion 36 of the spring 30 has a tongue 40 extending rearwardly from its base 41. The tip 42 of the tongue 40 carries an upwardly projecting pin 43. From the top 44 of the pin 43 are a pair of forward and- downward ramps 45 and 50 symmetrically on each side of axis 31 which extend to the tongue 40 at the upper level 46 from tongue base 41 to tongue tip 42. The tongue is as though cut out and spaced from the spaced surround 47 of the tongue rearwardly from the base.

The top wall 21 has a plurality of through apertures 49 identical and spaced center-to-center longitudinally an integral number of modular lengths of the integrated circuit chips used. The forward part of the pin is contoured cylindrically to match the inner contour of the circular apertures 49. The terms forward, up, down, rearward, etc., are used for convenience of description and are not intended as limitations of placement.

The carrier 20 may be such as that described in Mr. Murphy's U.S. Pat. No. 4,598,820 mentioned above. Furthermore, the forward portion 32 of the spring 30 may, as described in this patent, include a plurality of longitudinally successive rhomboidal sections 48 laterally expansible and longitudinally compressible. The spring 30 may be made of the same elastomeric material as the spring of the patent.

In using this combination of carrier and spring, the relatively flat chip 26 is first entered in the relatively flat channel 25 with the depending legs 27 received in the side aisles 23, 24. The chip is pushed forward by entering the front end or forward portion of the relatively flat spring 30 into the channel with the abutment 34 abutting the chip 26 and also pushing the chip forward. When the pin 43 reaches the channel 25, the ramps 45 and 50 cam the pin 43 down against the resilience of the tongue 40. By this means the pin further enters the channel and the spring forward abutment 34 pushes the chip 26 forward until there is resistance to forward travel. Further forward travel places the spring 30 under compression. The upward resilience of the tongue 40 causes the pin to enter the aperture. When further forward motion stops, the pin is locked or latched against reverse motion by the pin 43, and the chip 26 is held firmly against further movement relative to the carrier 20. If the chip 26 has not reached the end of the travel, further pressure on the rear end of the spring 30 will cause cam action again by the ramps 45 and 50, and if the end of travel has been reached, the spring 30 may be compressed within the channel until the pin enters the next aperture 49. The chip may be released by forcing the pin 43 down to release the latch. If the pin 43 is latched in the first aperture at the rear, the spring 30 is thus readily released and the spring and chip 26 readily removed. A convenient way of exerting force on the top of the pin 43 against the resilience of the tongue 40 to release the latch is by using a pencil or stylus to push the pin 43 down from outside the carrier 20. A blank chip or any suitable pusher may be used to move the spring 30 within the channel 25. The spring 30 may be made in volume and used as required with carriers and chips that are available.

Referring to FIGS. 5-8, a preferred embodiment of the invention comprises a carrier 20 as in FIGS. 1-4, and a spring 51. The carrier is like the carrier of FIG. 1 and therefore bears the same reference numerals as in FIG. 1. The forward portion 32 of the spring 51 is like the forward portion of the spring 30, and therefore its parts bear the same reference numerals. the longitudinal axis is here designated 53. In this embodiment, the rear portion 56 of the spring 51 is different from the rear portion 36 of the spring 30 of FIGS. 1-4, and is designated 56. The rear portion 56 has a tongue 57 which extends forward from a rearmost ledge 58 formed from a surround 59 to which ledge the base 60 of the tongue 57 is attached. The ledge 58 is below the upper level of the surround 59. The tongue 57 extends forward and upward at an incline 61 from the ledge 58 to a level 62 and then forward to the tip end 63 from which a pin 65 projects up. The rear of the pin 65 is cylindrical to match the contour of the apertures 49. From the top of the pin 65 are a pair of ramps 66 and 67 symmetrical about the axis and down to the tongue level 62.

In employing this embodiment with the carrier 20, a chip 26, as before, may be inserted into the channel 25 as with the legs 27 in the side aisles 23, 24. Then the spring 51 is inserted forward end first to push the chip 26 further in, until it reaches the end of its travel. The spring 51 is then compressed until the pin 65 reaches and is urged by the resilience of the tongue 57 to enter an aperture 49. The pin 65 is then held in position to hold the chip 26 firmly and safely in position in the carrier 20 by the resilience of the spring 30. If the spring is to be moved forward, the pin 65 is cammed down by action of the ramps 66 and 67. Further operation will be clear from the above. The preferred embodiment has the further advantage that by locating the tongue to extend forward of the ledge, the pin on the tongue may be located more remote from the rear end of the channel. This makes it easier to bring the spring into engagement without excessive compression. It also makes it easier to coordinate the location of the apertures 49 relative to the rear end of the carrier so that when the spring is pushed into the carrier 20, the pin 65 reaches the rearmost aperture when the rear end of the aperture is aligned with the rear end of the carrier 20.

Furthermore, it will be apparent (but not illustrated) that one may use a spring at the other, far, forward end of the carrier 20, to hold one or more chips in place. In using the chip at that far end, the direction of entry is reversed, forward becoming rearward and vice versa.

Either spring described herein may be made in its entirety in one piece, as noted, and of the same material as that of the material of the spring of my cited patent.

It is therefore apparent that there has been disclosed the combination of a spring and carrier, and a carrier, which afford flexibility and convenience in use.

We claim:

1. A device for insertion in the end of a tubular carrier for integrated circuits to secure the same from sliding and chipping them during transport, said device comprising:
    an elongated one piece longitudinally compressible spring which is slidable forward into the tubular carrier channel, having a longitudinally forward end abutting the circuit chip and another, longitudinally rearward end,
    the rearward end having a rearwardly extending longitudinal extension, the extension having a portion transversely upwardly resilient tongue carrying an upwardly projecting pin resiliently biased against the top wall by the resilience of the tongue and forming with the top wall a latch when the spring is compressed with its forward end abutting the chip, thereby to hold the spring in compression against the circuit chip.

2. A device as specified in claim 1, wherein the top wall has a through aperture, the resiliently biased upwardly facing pin arranged to enter and form with the aperture the latch.

3. A device as specified in claim 2, the portion comprising the tongue having a free, tip end on which the pin is mounted, the tongue being upwardly resiliently biased to provide the upward biasing of the pin,
    the tongue having a camming means comprising a ramp means extending from the tongue forwardly.

4. A device as specified in claim 3, the tongue having a base, the free tip end of the tongue being forward of the base.

5. A device as specified in claim 3, the extension comprising a surround having a rearward ledge, the tongue extending within the surround forward from the ledge.

6. A device as specified in claim 3, the pin having a top and the ramp means comprising a ramp which is slanted downwardly from the top of the pin.

7. A device as specified in claim 3, the integrated circuit having one of a number of longitudinal lengths, there being a plurality of identical apertures in the top wall, the apertures having centers spaced longitudinally center-to-center successively a number of lengths equal to an integral number of chip lengths.

8. A device as specified in claim 3, the extension having a surround about the tongue and having a rearmost part with a ledge, the tongue having a base connected to the ledge, a part extending forward and upward, and a level extending forward to the tip end of the tongue.

9. A device as specified in claim 8, the pin having a rear partially cylindrical.

10. A device as specified in claim 9, the pin having a base and a top, the ramp means comprising a pair of opposed ramps on opposite axial sides from the top of the pin forwardly and downward to the level.

11. An elongated one piece longitudinally compressible substantially flat spring having a forward longitudinal portion having a forward end to abut a circuit chip and another longitudinal rearward portion, the rearward portion having a longitudinal extension having an upwardly resilient tongue having a base connected to the extension, the tongue having a free, tip end, an upwardly jutting pin carried by the tip end, the pin having a top, and ramp means extending from the top of the tongue downward and forward.

12. An elongated one piece spring as claimed in claim 11, the tip of the tongue being forward of the base.

13. An elongated one piece spring as claimed in claim 11, the tip of the tongue being rearward of the base.

14. An elongated one piece spring as claimed in claim 11, the rear portion of the spring having a surround about the tongue.

15. An elongated one piece spring as claimed in claim 11, the extension having a surround with a rearmost ledge, the tongue being within the surround and having the base connected to the ledge, the tongue including an incline forward and upward of the ledge, and a level from the incline to the free, tip end, the pin jutting up from the free end.

16. An elongated one piece spring as claimed in claim 15, the pin having a forward part cylindrically vertical, the pin having a top, the ramp means comprising a pair of forwardly extending ramps symmetrically on opposite sides of the axis descending to the level.

17. An elongated one piece spring as claimed in claim 16, the spring comprising a forward portion having a plurality of longitudinally successive rhomboidal sections. laterally expansible and longitudinally compressible.

* * * * *